(12) United States Patent
McLellan et al.

(10) Patent No.: US 7,411,289 B1
(45) Date of Patent: Aug. 12, 2008

(54) INTEGRATED CIRCUIT PACKAGE WITH PARTIALLY EXPOSED CONTACT PADS AND PROCESS FOR FABRICATING THE SAME

(75) Inventors: Neil McLellan, Danville, CA (US); Geraldine Tsui Yee Lin, Hong Kong (HK); Chun Ho Fan, Sham Tseng (HK); Mohan Kirloskar, Cupertino, CA (US); Ed A. Varga, San Leandro, CA (US)

(73) Assignee: ASAT Ltd., Tsuen Wan, New Territories (HK)

( * ) Notice: Subject to any disclaimer, the term of this patent is extended or adjusted under 35 U.S.C. 154(b) by 0 days.

(21) Appl. No.: 10/891,709

(22) Filed: Jul. 15, 2004

Related U.S. Application Data

(63) Continuation-in-part of application No. 10/865,760, filed on Jun. 14, 2004, now Pat. No. 7,091,581.

(51) Int. Cl.
*H01L 23/498* (2006.01)
(52) U.S. Cl. .............. 257/700; 257/676; 257/E23.061
(58) Field of Classification Search .............. 257/666, 257/670, 672, 676, 678, 690–700, 737, 738, 257/780–784, E23.031, E23.061
See application file for complete search history.

(56) References Cited

U.S. PATENT DOCUMENTS

| | | | |
|---|---|---|---|
| 4,530,152 A | 7/1985 | Roche et al. | 29/588 |
| 4,685,998 A | 8/1987 | Quinn et al. | 216/14 X |
| 4,812,896 A | 3/1989 | Rothgery et al. | 357/70 |
| 5,066,831 A | 11/1991 | Spielberger et al. | 361/412 |
| 5,157,475 A * | 10/1992 | Yamaguchi | 257/784 |
| 5,157,480 A | 10/1992 | McShane et al. | 361/404 |
| 5,172,213 A | 12/1992 | Zimmerman | 257/796 |
| 5,200,362 A | 4/1993 | Lin et al. | 437/207 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,221,642 A | 6/1993 | Burns | 437/207 |
| 5,273,938 A | 12/1993 | Lin et al. | 437/207 |
| 5,277,972 A | 1/1994 | Sakumoto et al. | 428/355 |

(Continued)

FOREIGN PATENT DOCUMENTS

DE 10015962 A1 10/2001

(Continued)

*Primary Examiner*—Marcos D. Pizarro
(74) *Attorney, Agent, or Firm*—Morrison & Foerster LLP

(57) ABSTRACT

A process for fabricating an integrated circuit package includes: selectively etching a leadframe strip to define a die attach pad and at least one row of contact pads; mounting a semiconductor die to one side of the leadframe strip, on the die attach pad; wire bonding the semiconductor die to ones of the contact pads; releasably clamping the leadframe strip in a mold by releasably clamping the contact pads; molding in a molding compound to cover the semiconductor die, the wire bonds and a portion of the contact pads not covered by the clamping; releasing the leadframe strip from the mold; depositing a plurality of external contacts on the one side of the leadframe strip, on the contact pads, such that the external contacts protrude from the molding compound; mounting at least one of an active and a passive component to a second side of said leadframe strip; and singulating to provide the integrated circuit package.

14 Claims, 15 Drawing Sheets

U.S. PATENT DOCUMENTS

| | | | | |
|---|---|---|---|---|
| 5,279,029 A | 1/1994 | Burns | | 29/856 |
| 5,293,072 A | 3/1994 | Tsuji et al. | | 257/737 |
| 5,311,060 A | 5/1994 | Rostoker et al. | | 257/796 |
| 5,332,864 A | 7/1994 | Liang et al. | | 174/52.4 |
| 5,339,216 A | 8/1994 | Lin et al. | | 361/707 |
| 5,343,076 A | 8/1994 | Katayama et al. | | 257/717 |
| 5,406,124 A | 4/1995 | Morita et al. | | 257/783 |
| 5,424,576 A | 6/1995 | Djennas et al. | | 257/666 |
| 5,444,301 A | 8/1995 | Song et al. | | 257/737 |
| 5,457,340 A | 10/1995 | Templeton, Jr. et al. | | 257/666 |
| 5,474,958 A | 12/1995 | Djennas et al. | | 437/211 |
| 5,493,153 A | 2/1996 | Arikawa et al. | | 257/796 |
| 5,604,376 A | 2/1997 | Hamburgen et al. | | 257/676 |
| 5,608,267 A | 3/1997 | Mahulikar et al. | | 257/796 |
| 5,610,442 A | 3/1997 | Schneider et al. | | 257/787 |
| 5,639,694 A | 6/1997 | Diffenderfer et al. | | 437/209 |
| 5,639,990 A | 6/1997 | Nishihara et al. | | 174/52.2 |
| 5,640,047 A | 6/1997 | Nakashima | | 257/738 |
| 5,641,997 A | 6/1997 | Ohta et al. | | 257/788 |
| 5,646,831 A | 7/1997 | Manteghi | | 361/813 |
| 5,650,663 A | 7/1997 | Parthasarathi | | 257/706 |
| 5,679,978 A | 10/1997 | Kawahara et al. | | 257/697 |
| 5,683,806 A | 11/1997 | Sakumoto et al. | | 428/343 |
| 5,696,666 A | 12/1997 | Miles et al. | | 361/784 |
| 5,701,034 A | 12/1997 | Marrs | | 257/706 |
| 5,705,851 A | 1/1998 | Mostafazadeh et al. | | 257/675 |
| 5,710,064 A | 1/1998 | Song et al. | | 437/220 |
| 5,710,695 A | 1/1998 | Manteghi | | 361/813 |
| 5,777,382 A | 7/1998 | Abbott et al. | | 257/695 |
| 5,894,108 A | 4/1999 | Mostafazadeh et al. | | 174/52.4 |
| 5,973,393 A | 10/1999 | Chia et al. | | |
| 5,976,912 A | 11/1999 | Fukutomi et al. | | 438/110 |
| 5,986,885 A | 11/1999 | Wyland | | 361/704 |
| 6,001,671 A | 12/1999 | Fjelstad | | 438/112 |
| 6,028,358 A * | 2/2000 | Suzuki | | 257/737 |
| 6,037,658 A | 3/2000 | Brodsky et al. | | 257/707 |
| 6,057,601 A | 5/2000 | Lau et al. | | 257/730 |
| 6,194,786 B1 | 2/2001 | Orcutt | | 257/780 |
| 6,229,200 B1 | 5/2001 | Mclellan et al. | | 257/666 |
| 6,236,568 B1 | 5/2001 | Lai et al. | | 361/704 |
| 6,251,706 B1 | 6/2001 | Paniccia | | 438/122 |
| 6,294,830 B1 | 9/2001 | Fjelstad | | 257/724 |
| 6,303,997 B1 | 10/2001 | Lee | | |
| 6,306,685 B1 | 10/2001 | Liu et al. | | 438/121 |
| 6,323,066 B2 | 11/2001 | Lai et al. | | 438/122 |
| 6,380,620 B1 * | 4/2002 | Suminoe et al. | | 257/706 |
| 6,414,385 B1 | 7/2002 | Huang et al. | | 257/690 |
| 6,459,163 B1 | 10/2002 | Bai | | 257/787 |
| 6,462,405 B1 | 10/2002 | Lai et al. | | 257/675 |
| 6,498,099 B1 | 12/2002 | McLellan et al. | | 438/689 |
| 6,525,421 B1 | 2/2003 | Chia et al. | | 257/730 |
| 6,528,877 B2 | 3/2003 | Ernest et al. | | 251/707 |
| 6,545,345 B1 * | 4/2003 | Glenn et al. | | 257/676 |
| 6,583,354 B2 * | 6/2003 | Alcoe | | 174/525 |
| 6,585,905 B1 | 7/2003 | Fan et al. | | 216/14 |
| 6,631,078 B2 | 10/2003 | Alcoe et al. | | 361/719 |
| 6,635,957 B2 | 10/2003 | Kwan et al. | | 257/691 |
| 6,661,083 B2 | 12/2003 | Lee et al. | | |
| 6,667,073 B1 * | 12/2003 | Lau et al. | | 427/96.2 |
| 6,713,849 B2 | 3/2004 | Hasebe et al. | | |
| 6,722,557 B2 | 4/2004 | Tanaka | | |
| 6,723,585 B1 | 4/2004 | Tu et al. | | |
| 6,730,544 B1 | 5/2004 | Yang | | |
| 6,803,648 B1 | 10/2004 | Kelkar et al. | | |
| 2001/0015492 A1 | 8/2001 | Akram et al. | | 257/706 |
| 2002/0005578 A1 | 1/2002 | Kodama et al. | | 257/727 |
| 2002/0006718 A1 | 1/2002 | Distefano | | 438/617 |
| 2002/0185734 A1 | 12/2002 | Zhao et al. | | 257/737 |
| 2003/0015780 A1 | 1/2003 | Kang et al. | | 257/684 |
| 2003/0034569 A1 | 2/2003 | Caletka et al. | | 257/796 |

FOREIGN PATENT DOCUMENTS

| | | | |
|---|---|---|---|
| JP | SHO 59-208756 | 11/1984 | |

* cited by examiner

INTEGRATED CIRCUIT PACKAGE WITH PARTIALLY EXPOSED CONTACT PADS AND PROCESS FOR FABRICATING THE SAME

CROSS-REFERENCE TO RELATED APPLICATION

This is a continuation-in-part of applicant's U.S. patent application Ser. No. 10/865,760, filed Jun. 14, 2004 now U.S. Pat. No. 7,091,581, entitled Integrated Circuit Package and Process for Fabricating the Same.

FIELD OF THE INVENTION

The present invention relates in general to integrated circuit packaging and more particularly to a process for fabricating an improved integrated circuit package.

BACKGROUND OF THE INVENTION

According to well known prior art IC (integrated circuit) packaging methodologies, semiconductor dice are singulated and mounted using epoxy or other conventional means onto respective die attach pads (attach paddles) of a leadframe strip. Traditional QFP (Quad Flat Pack) packages incorporate inner leads which function as lands for wire bonding the semiconductor die bond pads. These inner leads typically require mold-locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting several hundred devices. Singulated IC dice are placed on the strip die attach pads using conventional die mount and epoxy techniques. After curing of the epoxy, the dice are wire bonded to the peripheral internal leads by gold (Au), copper (Cu), aluminum (Al) or doped aluminum wire bonding. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die pad is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, the contents of which are incorporated herein by reference.

In applicant's own U.S. Pat. No. 6,585,905, issued Jul. 1, 2003 and incorporated herein by reference, a process is provided for fabricating a leadless plastic chip carrier in which the semiconductor die sits in a portion of the die attach pad that is reduced in thickness. The leadframe strip is selectively etched to define a pattern for the die attach pad and the contact pads such that a portion of the die attach pad has reduced thickness compared to the thickness of the contact pads. The semiconductor die is mounted in the portion of the die attach pad with reduced thickness, followed by wire bonding and overmolding. This structure provides for several advantages. For example, the package profile can be reduced and the length of the wire bonds from the semiconductor die to the die attach pad and to the contact pads is reduced, thereby reducing electrical impedance in the package. Also, the three-dimensional nature of the die attach pad provides additional exposed metal for adhering to the molding compound, thereby providing a more robust package.

Still further improvements in high performance integrated circuit (IC) packages are driven by industry demands for increased thermal and electrical performance, decreased size and cost of manufacture.

SUMMARY OF THE INVENTION

According to an aspect of the present invention, there is provided a process for fabricating an integrated circuit package. The process includes: selectively etching a leadframe strip to define a die attach pad and at least one row of contact pads; mounting a semiconductor die to one side of the leadframe strip, on the die attach pad; wire bonding the semiconductor die to ones of the contact pads; releasably clamping the leadframe strip in a mold by releasably clamping the contact pads; molding in a molding compound to cover the semiconductor die, the wire bonds and a portion of the contact pads not covered by the clamping; releasing the leadframe strip from the mold; depositing a plurality of external contacts in the form of solder ball contacts, on the one side of the leadframe strip, on the contact pads, such that the external contacts protrude from the molding compound; mounting at least one of an active and a passive component to a second side of said leadframe strip; and singulating to provide the integrated circuit package.

According to another aspect of the present invention, there is provided an integrated circuit package including a semiconductor die mounted to a die attach pad and at least one row of contact pads circumscribing the die attach pad. Wire bonds connect the semiconductor die to ones of the contact pads. A molding compound covers one side of the semiconductor die, the wire bonds and a portion of one side of the contact pads such that a remaining portion of the one side of the contact pads is uncovered and a second side of the contact pads is uncovered. External contacts are disposed on the one side of the contact pads, at the uncovered remaining portion, such that the external contacts protrude from the molding compound. At least one of an active and a passive component is mounted to the second side of one of the die attach pad and ones of the contact pads.

Advantageously, passive components are integrated into the package to provide a system-in-package integrated circuit package. In a particular aspect of an embodiment, the package includes two semiconductor dice, separated by a die attach pad. Advantageously, the die attach pad, when grounded, shields the bottom semiconductor die from electromagnetic interference. This is particularly useful in radiofrequency (RF) applications. In yet another aspect, a pretested package is mounted to the backside of the fabricated package using suitable means such as conductive epoxy or solder paste reflow technique. In still another aspect, stacked packages include passive components, thereby providing system-in-package integrated circuit packages.

BRIEF DESCRIPTION OF THE DRAWINGS

The invention will be better understood with reference to the drawings and to the following detailed description in which like numerals denote like parts, and in which.

DETAILED DESCRIPTION OF THE PREFERRED EMBODIMENTS

Figure 1A:
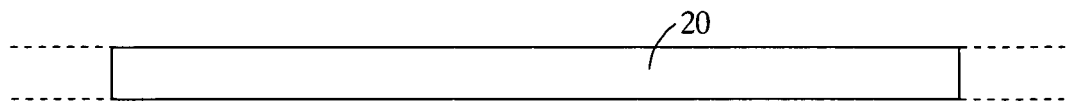
FIGS. 1A to 1J show processing steps for fabricating an integrated circuit package according to an embodiment of the present invention.

Reference is made to the Figures to describe a process for fabricating an integrated circuit package according to an embodiment of the present invention. The integrated circuit package is indicated generally by the numeral 18 and includes a semiconductor die 22 mounted to a die attach pad 24 and at least one row of contact pads 26 circumscribing the die attach pad 24. Wire bonds 28 are then bonded to connect the semiconductor die 22 to ones of the contact pads 26. A molding compound 30 covers one side of the semiconductor die 22, the wire bonds 28 and a portion 32 of one side of the contact pads 26 such that a remaining portion 34 of the one side of the contact pads 26 is uncovered and a second side of the contact pads 26 is uncovered. External contacts 36 are disposed on the one side of the contact pads, at the uncovered remaining portion 34, such that the external contacts 36 protrude from the molding compound 30.

The integrated circuit package 18 will now be described in more detail with reference to FIGS. 1A to 1J, which show process steps for fabricating the integrated circuit package 18 in accordance with an embodiment of the present invention. As will be understood by those of skill in the art, the integrated circuit package 18 of the present invention is a leadless plastic chip carrier.

Referring first to FIG. 1A, an elevation view is provided of a Cu (copper) panel substrate that forms the raw material of the leadframe strip 20. As discussed in detail in Applicant's U.S. Pat. No. 6,229,200, the contents of which are incorporated herein by reference, the leadframe strip 20 is divided into a plurality of sections, each of which incorporates a plurality of units in an array (e.g. 3×3 array, 5×5 array, etc.). Only one such whole unit is depicted in the elevation view of FIG. 1A, portions of adjacent units being represented by stippled lines. It will be appreciated that adjacent units of the leadframe strip 20 are similar to the unit depicted in the Figures. It will also be appreciated that although the following description particularly describes a single unit of the leadframe strip 20, the integrated circuit package is gang fabricated and each step of the process is carried out for each unit of the leadframe strip.

Figure 1B:
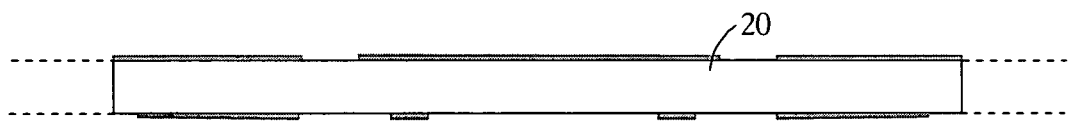
Figure 1C:
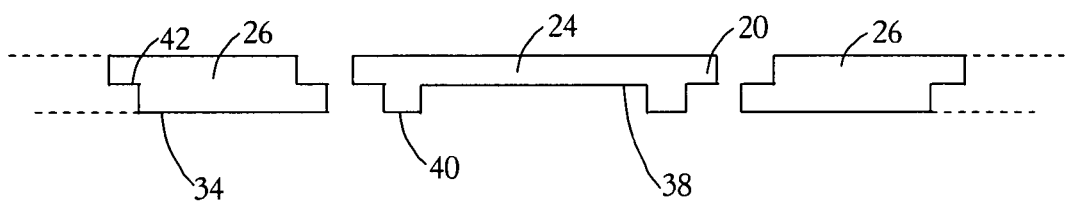

Referring to FIGS. 1B and 1C, the leadframe strip 20 is selectively etched to pattern the die attach pad 24 and contact pads 26 for each unit. The selective etch is carried out by coating both sides of the leadframe 20 with a layer of photo-imageable etch resist such as photo-imageable epoxy. The etch resist is spin coated on the leadframe strip 20 and selectively exposed on the sides of the leadframe strip 20, with ultraviolet light using a photo-tool. The exposed portions are then removed. As best shown in FIG. 1B, the etch resist is thereby patterned to provide pits on the two sides of the leadframe strip 20, in which the metal substrate is exposed. The leadframe strip 20 is then etched in a conventional manner such as immersion or pressurized spray etching, to thereby pattern the die attach pad 24 and the contact pads 26. The etch resist is then stripped away by conventional means. The resulting leadframe strip 20 is shown in FIG. 1C.

As shown in FIGS. 1B and 1C, the etch resist is patterned such that the resulting die attach pad 24 of the leadframe strip 20 has a central portion 38 with a thickness that is less than the thickness of the raw material of the leadframe strip 20. The thickness of the resulting central portion 38 is less than the thickness of the remaining portion 34 of the contact pads 26, on which the external contacts 36 are later mounted. Clearly the central portion 38 of the leadframe strip 20 is appropriately sized and shaped to receive the semiconductor die 22. This reduction in thickness of the central portion 38 of the die attach pad 24 results in the formation of a ground ring 40 on the die attach pad 24, which circumscribes the central portion 38.

The contact pads 26 are also etched to provide portions of different thickness. As shown in FIG. 1C, the peripheral portions 42 of the contact pads 26 are selectively etched such that the peripheral portions 42 have a thickness that is less than the thickness of the raw material of the leadframe strip 20. Clearly the thickness of the peripheral portions 42 is less than the thickness of the remaining portion 34 of the contact pads 26. This variation in thickness facilitates bonding of the molding compound 30 with the contact pads 26 as an interlocking mechanical bond is provided between the molding compound 30 and the contact pads.

Figure 1D:
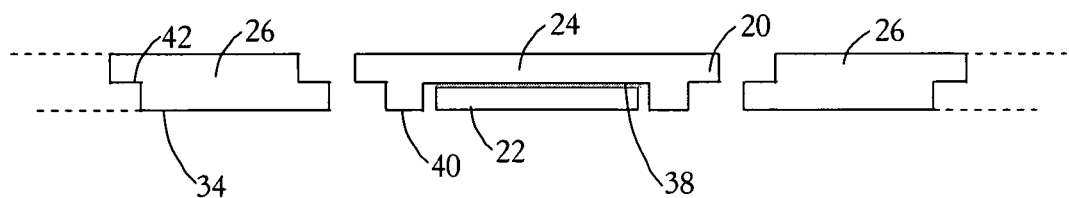
Figure 1E:
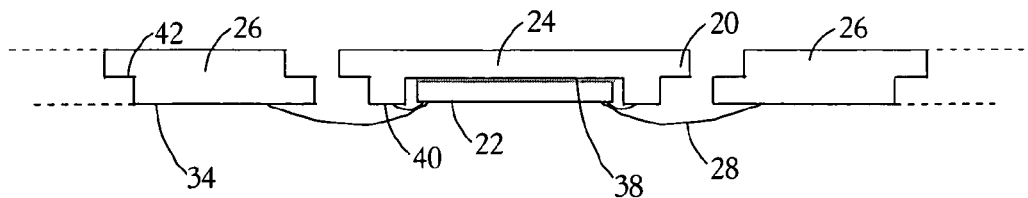

As shown in FIG. 1D, the singulated semiconductor die 22 is then mounted via epoxy (or other suitable means) to the central portion 38 of the die attach pad 24 and the epoxy is cured. Clearly, the semiconductor die 22 sits in a cavity, in the central portion 38 on one side of the die attach pad 24. Gold wire bonds 28 are then bonded between the semiconductor die 22 and ones of the contact pads 26 and between the semiconductor die 22 and the ground ring 40 (FIG. 1E).

Figure 1F:
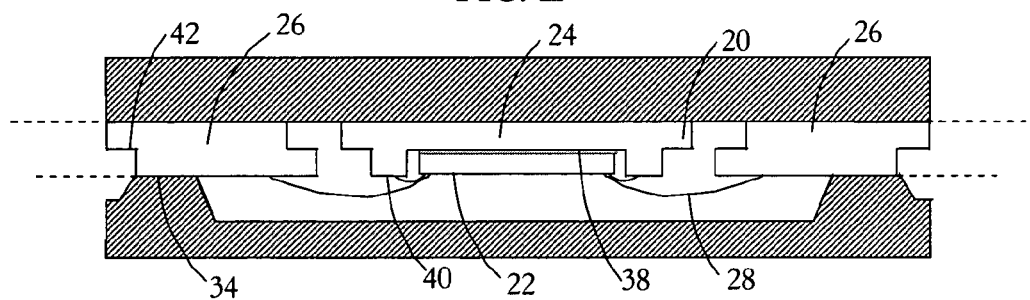
Figure 1G:
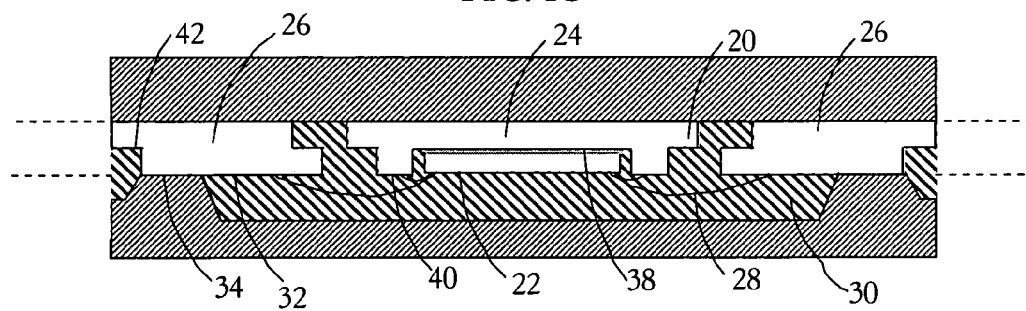

The leadframe strip 20 is then releasably clamped in a modified mold by releasably clamping the remaining portion 34 of the contact pads (FIG. 1F). Molding using a molding compound 30 follows (FIG. 1G). The molding compound 30 covers one side of the semiconductor die 22, the wire bonds 28 and the portion 32 of the contact pads 26 that is not covered by the mold during clamping. The opposing second side of the die attach pad 24 and the contact pads 26 is exposed. Clearly, the modified mold has a profile defining the bottom of the cavity, that results in varying thickness of the molding compound, as shown in FIG. 1G.

Figure 1H:
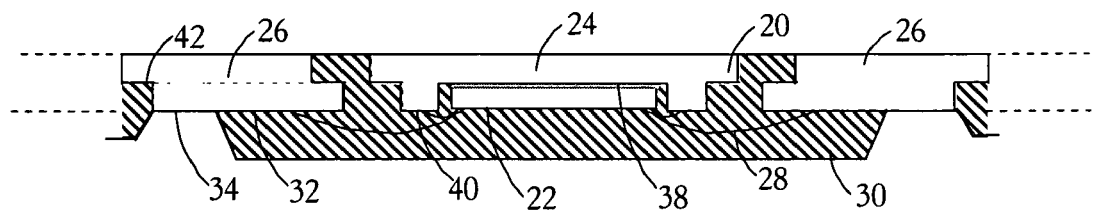

After curing the molding compound 30, the leadframe strip is released from the mold (FIG. 1H).

Figure 1I:
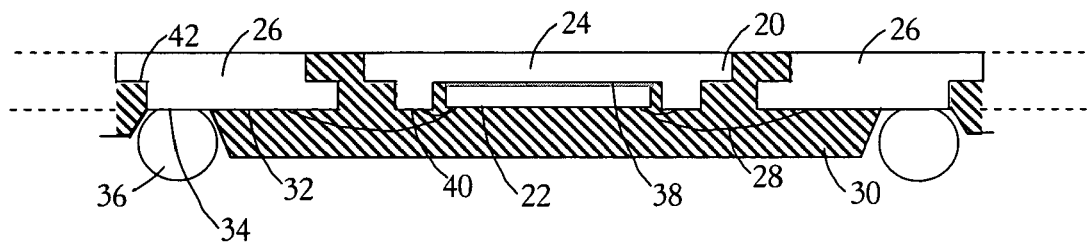

Next, a plurality of external contacts 36 in the form of solder ball contacts are deposited on the exposed remaining portion 34 on the one side of the contact pads 26 (FIG. 1I). The solder ball contacts are deposited by applying a flux to the exposed remaining portion 34 on the one side of the contact pads 26 and, after placement of the solder balls by pick and place technique, the solder balls are reflowed using known reflow techniques. As shown, the external contacts (solder balls) 36 protrude from the mold compound to provide integrated circuit package standoff. The external contacts 36 are thereby connected to the contact pads 26 and through the wire bonds 28 to the semiconductor die 22. The external contacts 36 thus provide signal and power connections for the semiconductor die 22. In the present embodiment, the external contacts are tin/lead eutectic solder.

Figure 1J:
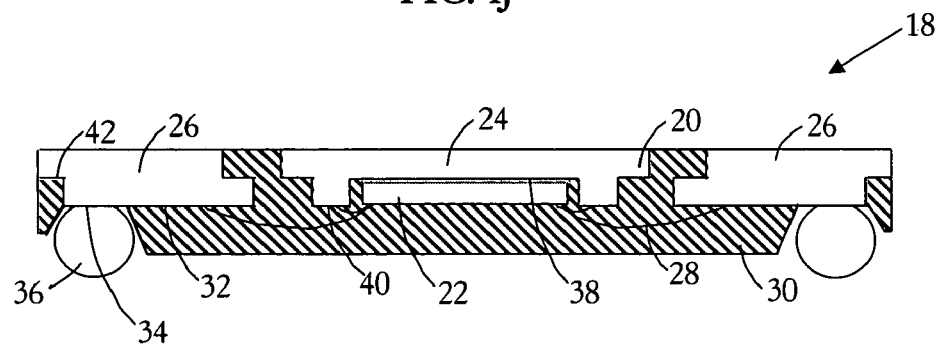

Singulation of the individual units from the full leadframe strip 20 is then performed by die punching, resulting in the integrated circuit package shown in FIG. 1J. In an alternative embodiment, the individual unit is singulated by saw singulation.

Reference is now made to FIGS. 2A to 2K to describe another embodiment of the present invention. FIGS. 2A to 2I are similar to FIGS. 1A to 1I described above. It will be understood that the process steps associated with FIGS. 2A to 2I are similar to the process steps associated with FIGS. 1A to 1I and are therefore not further described herein.

Figure 2A:
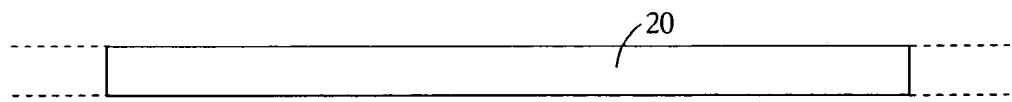
FIGS. 2A to 2K show processing steps for fabricating an integrated circuit package according to another embodiment of the present invention.
Figure 2B:
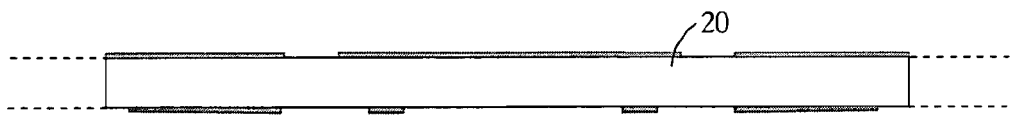
Figure 2C:
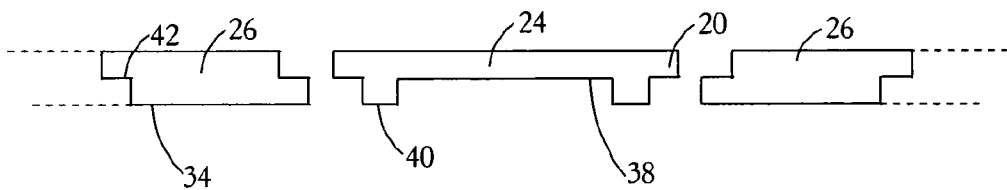
Figure 2D:
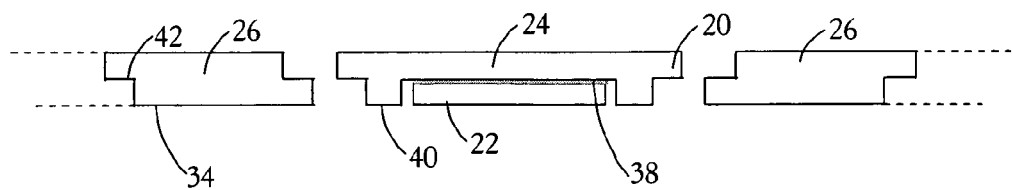
Figure 2E:
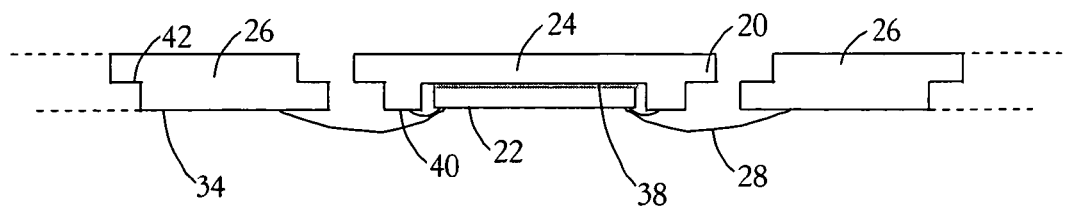
Figure 2F:
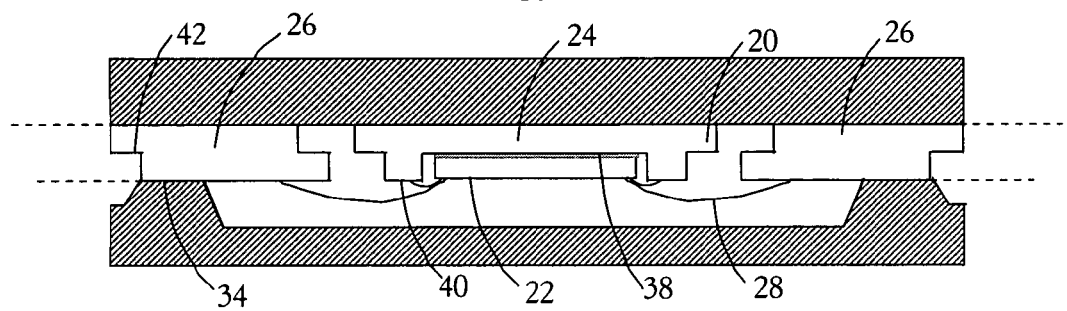
Figure 2G:
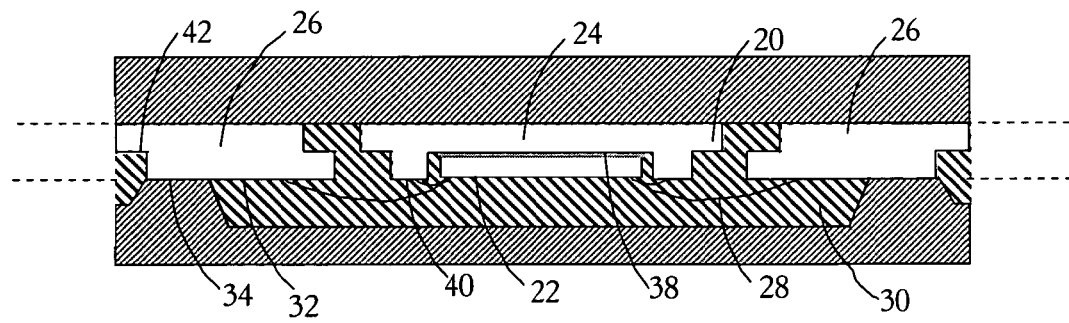
Figure 2H:
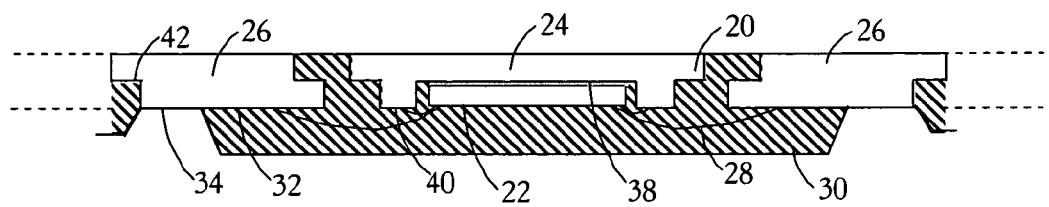
Figure 2I:
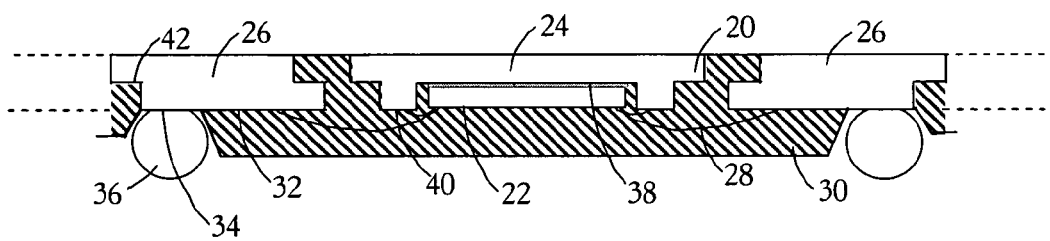
Figure 2J:
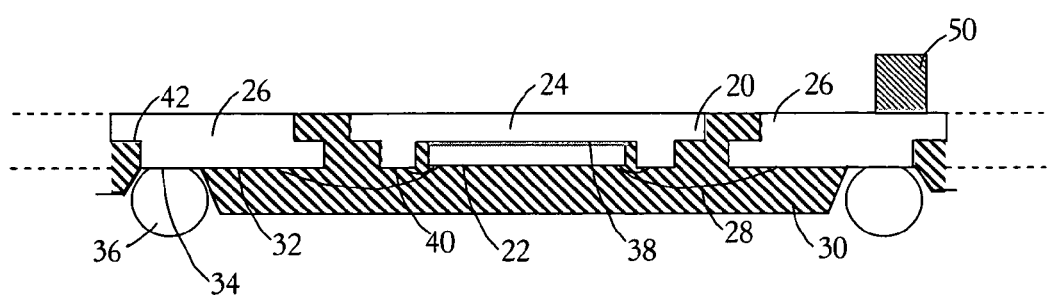

In FIG. 2J, however, a passive component 50 is mounted to the opposing second side of the leadframe strip 20. The passive component 50 is mounted to the opposing second side of ones of the contact pads 26 (on the side of the contact pads 26 that is opposite the side to which the external contacts 36 are attached). In the present embodiment, the passive component is a capacitor. Other passive components are possible, however, including for example, an inductor and a resistor. The passive component 50 is mounted to ones of the contact pads using conductive epoxy and the epoxy is cured.

Figure 2K:
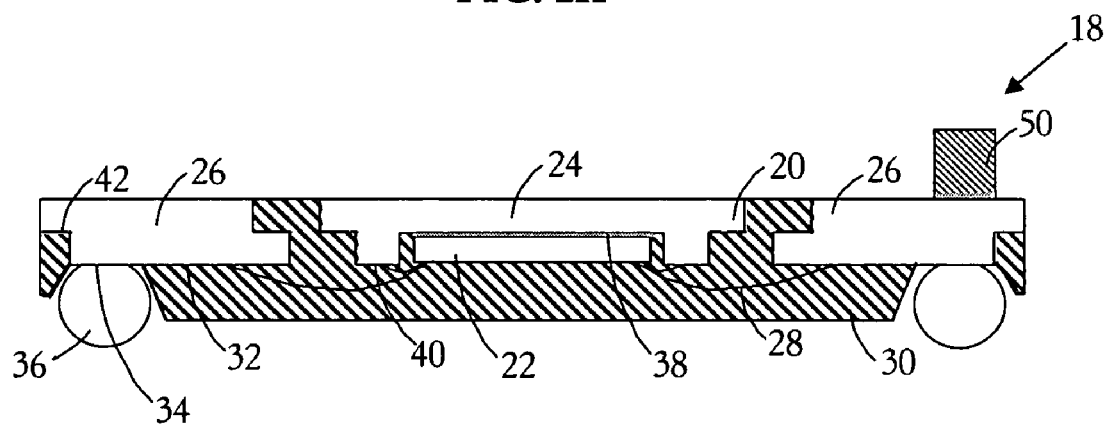

Next, the individual units are singulated from the leadframe strip 20 by one of die punching and saw singulation, resulting in the integrated circuit package shown in FIG. 2K.

Figure 3:
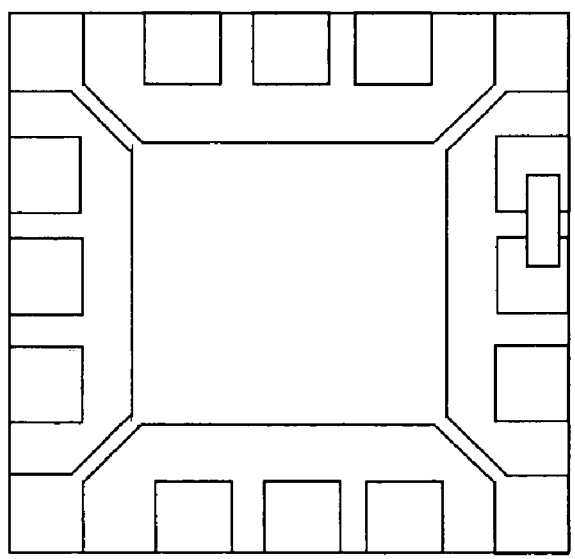
FIG. 3 shows a top plan view of the integrated circuit package of FIG. 4K.

FIG. 3 shows a top plan view of the integrated circuit package shown in FIG. 2K, including the passive component 50 epoxy attached to ones of the contact pads 26 to thereby provide a system-in-package integrated circuit package.

Referring now to FIGS. 4A to 4L, yet another embodiment of the present invention is shown. FIGS. 4A to 4I are similar to FIGS. 1A to 1I described above. It will be appreciated that the processing steps associated with FIGS. 4A to 4I are similar to the processing steps associated with FIGS. 1A to 1I and are therefore not further described herein.

Figure 4A:
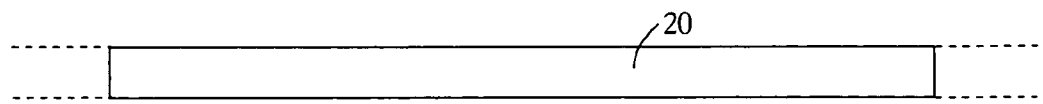
FIGS. 4A to 4L show processing steps for fabricating an integrated circuit package according to another embodiment of the present invention.
Figure 4B:
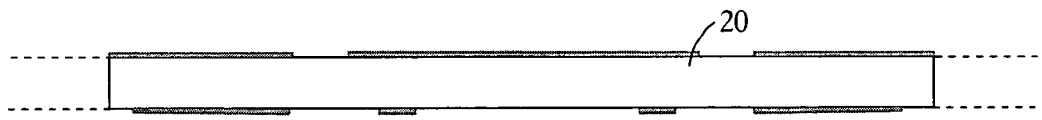
Figure 4C:
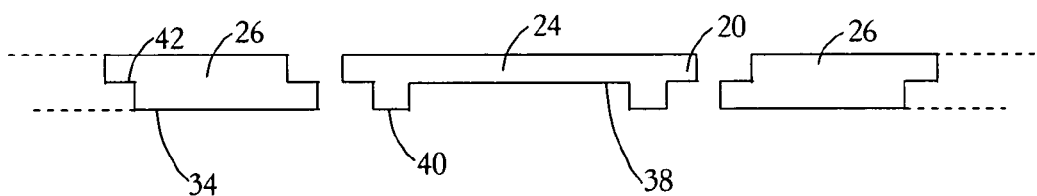
Figure 4D:
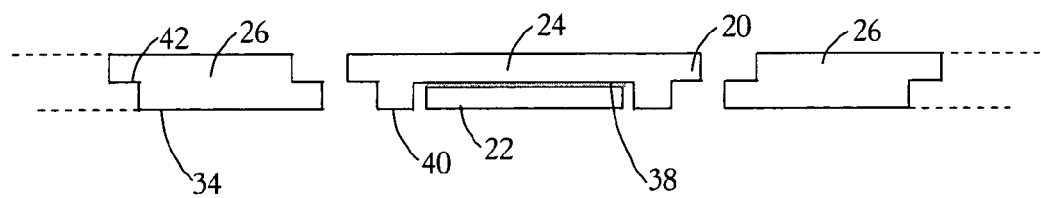
Figure 4E:
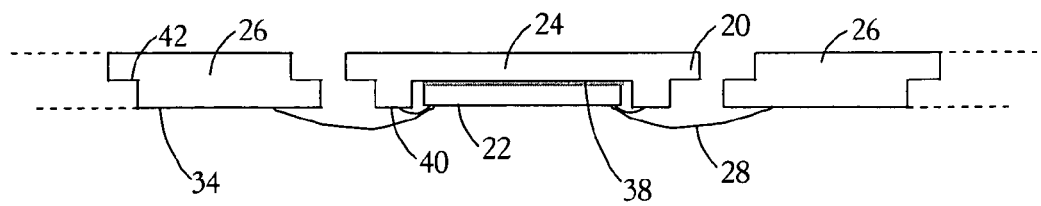
Figure 4F:
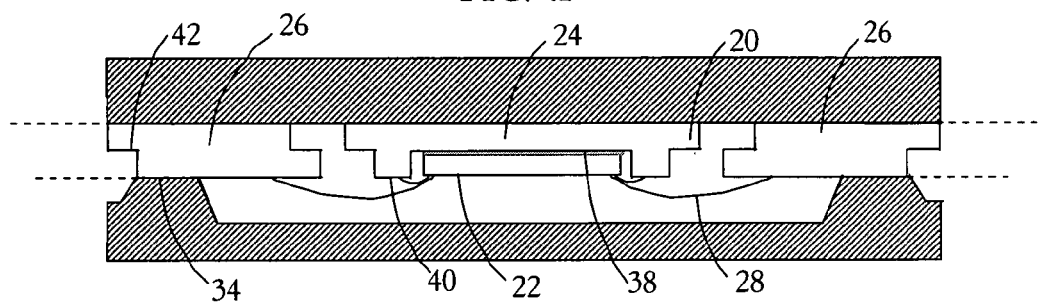
Figure 4G:
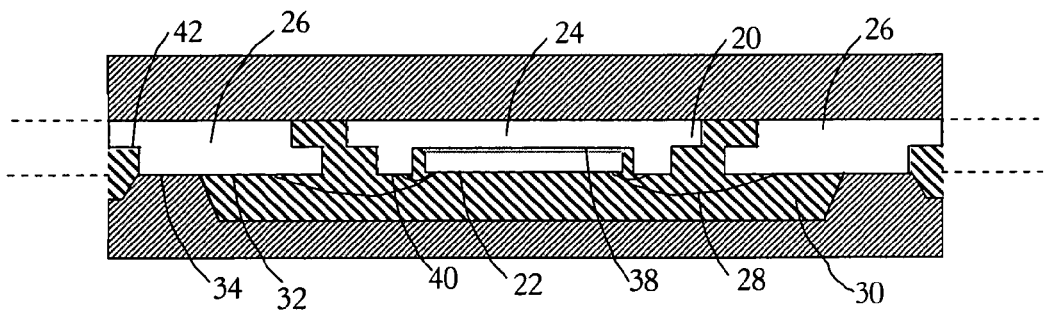
Figure 4H:
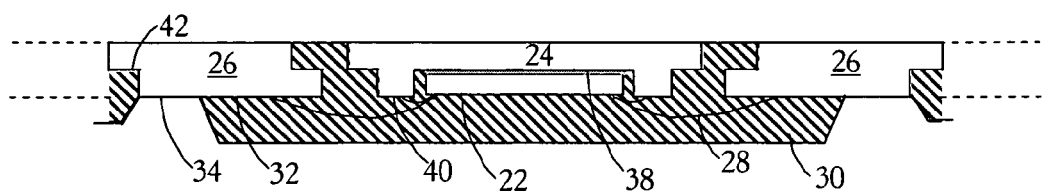
Figure 4I:
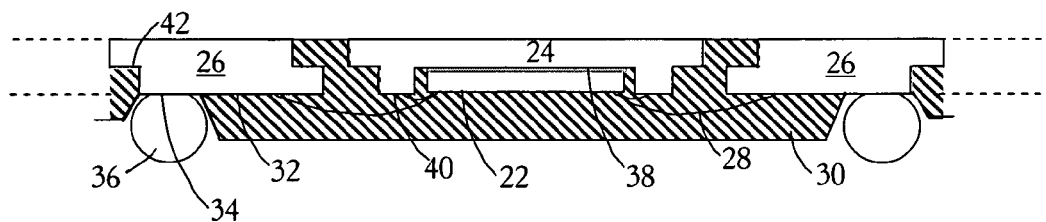
Figure 4J:
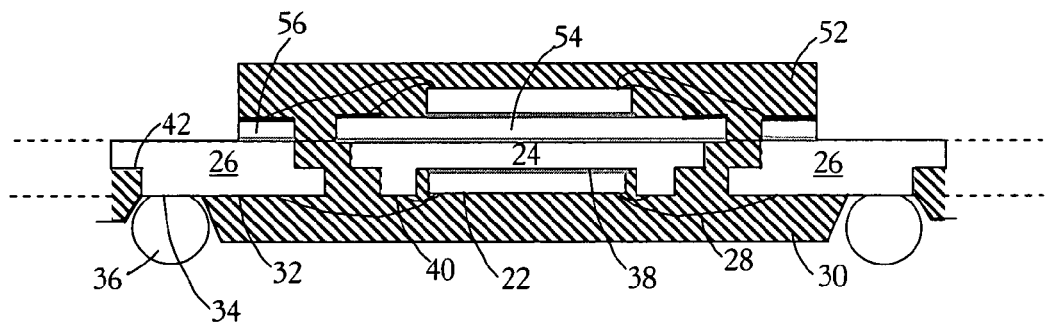

In FIG. 4J, a leadless plastic chip carrier 52, such as the type described in U.S. Pat. No. 6,229,200, the entire contents of which are incorporated herein by reference, is mounted to the opposing second side of the leadframe strip 20. The leadless plastic chip carrier 52 is mounted to the second side of the leadframe strip 20 by attaching the opposing second side of the die attach pad 24 (opposite the side to which the semiconductor die 22 is attached) to a die attach pad 54 of the leadless plastic chip carrier 52, using conductive epoxy. Interior portions of the opposing second side of the contact pads 26 (opposite the side to which the external contacts 36 are attached) are also attached to ones of contact pads 56 of the leadless plastic chip carrier 52, using conductive epoxy. The epoxy is then cured. Thus, an active component in the form of the leadless plastic chip carrier 52 is attached to the second side of the leadframe strip 20. In an alternative embodiment, a solder paste reflow technique is used to fix the leadless plastic chip carrier 52 to the second side of the leadframe strip 20, rather than conductive epoxy.

Figure 4K:
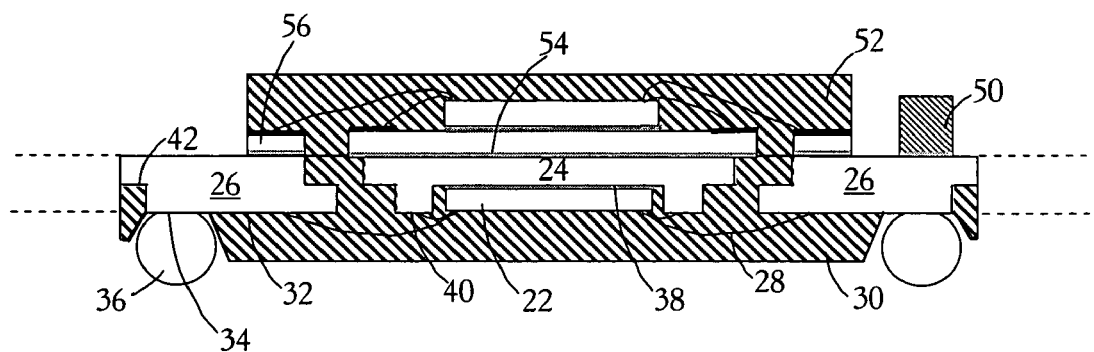

A passive component 50 is mounted to exposed portions of the opposing second side of the contact pads 26 using conductive epoxy and the epoxy is cured (FIG. 4K). The passive component 50 is one of a capacitor, an inductor, and a resistor.

Figure 4L:
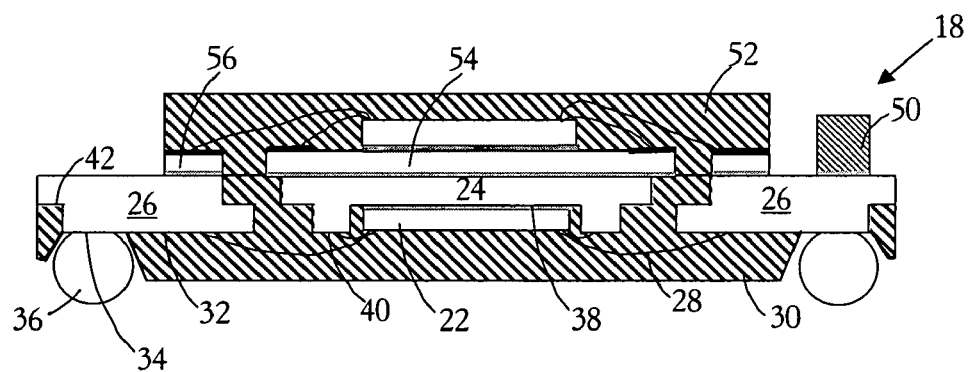

Next, the individual units are singulated from the full leadframe strip 20 by one of die punching and saw singulation, resulting in the integrated circuit package shown in FIG. 4L.

Figure 5A:
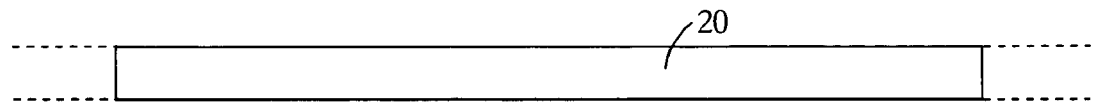
FIGS. 5A to 5K show processing steps for fabricating an integrated circuit package according to another embodiment of the present invention.
Figure 5B:
Figure 5C:
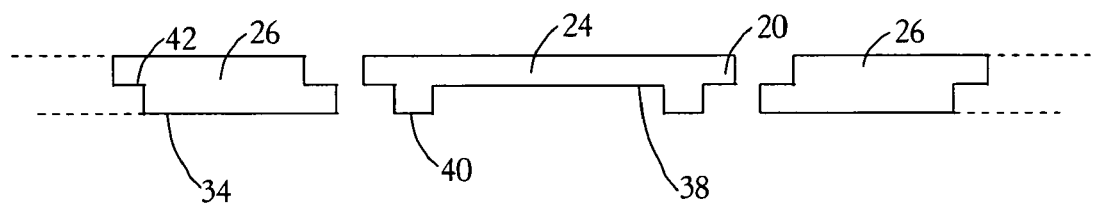
Figure 5D:
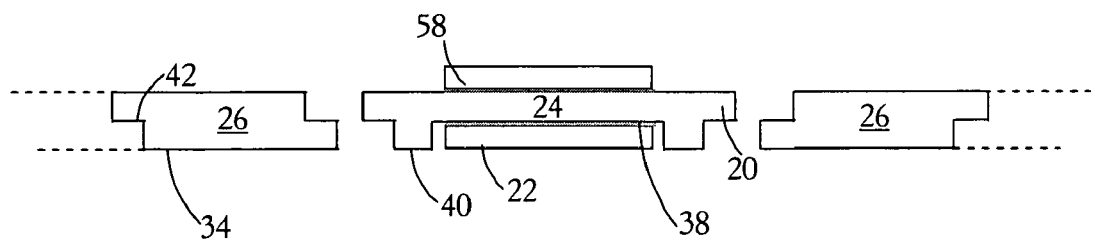

Reference is now made to FIGS. 5A to 5K to describe still another embodiment of the present invention. FIGS. 5A to 5C are similar to FIGS. 1A to 1C and therefore FIGS. 5A to 5C are not further described herein. As shown in FIG. 5D, the singulated semiconductor die 22 is mounted via epoxy to the central portion 38 of the die attach pad 24, and the epoxy is cured. As in FIG. 1D, the semiconductor die 22 is thereby mounted in a cavity in the central portion 38 on the one side of the die attach pad 24. Unlike FIG. 1D, however, a second semiconductor die 58 is mounted to the opposing second side of the die attach pad 24.

Figure 5E:
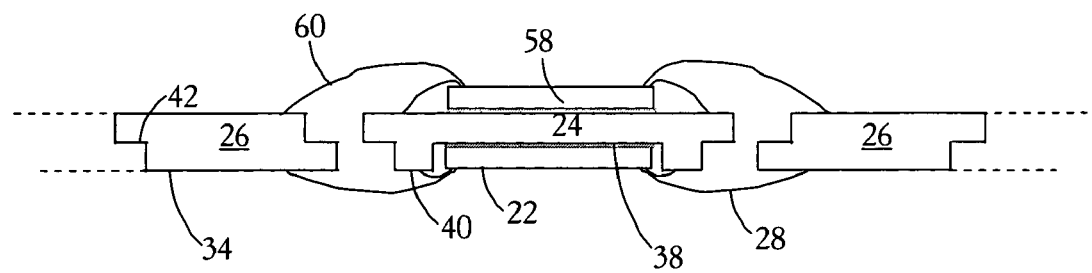

Gold wire bonds 28 are then bonded between the semiconductor die 22 and ones of the contact pad 26 and between the semiconductor die 22 and the ground ring 40. Gold wire bonds 60 are also bonded between the second semiconductor die 58 and ones of the contact pads 26 (FIG. 5E).

Figure 5F:
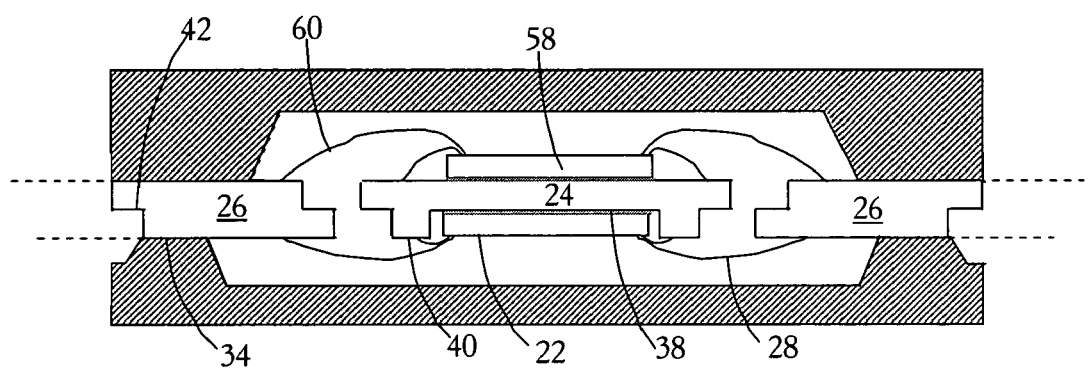
Figure 5G:
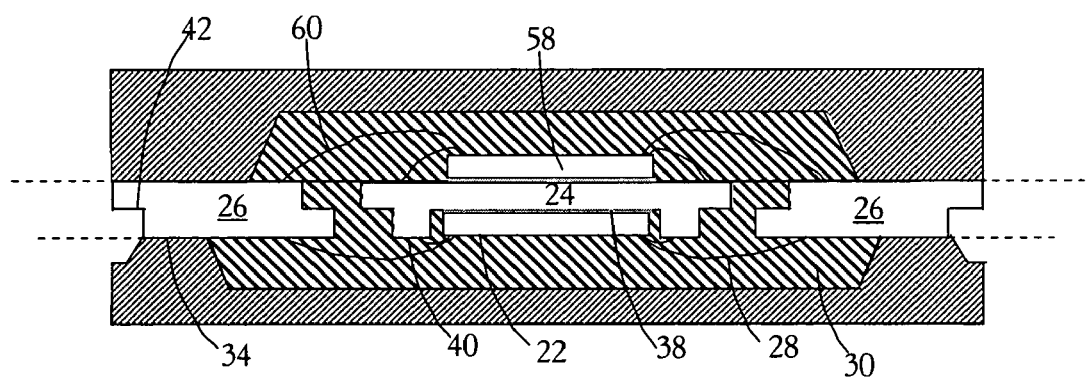

The leadframe strip 20 is then releasably clamped in a modified mold by releasably clamping the remaining portion 34 of the contact pads (FIG. 5F). Molding using a molding compound 30 follows (FIG. 5G). The molding compound 30 covers the semiconductor die 22, the wire bonds 28 and the portion 32 of the one side of the contact pads 26 that are not covered by the mold during clamping. The molding compound 30 also covers the second semiconductor die 58, the wire bonds 60 and a portion of the opposing second side of the contact pads 26 that is not covered by the mold during clamping. Clearly, the modified mold has a profile defining a bottom cavity and a top cavity that results in varying thickness of the molding compound 30, as shown in FIG. 5G.

Figure 5H:
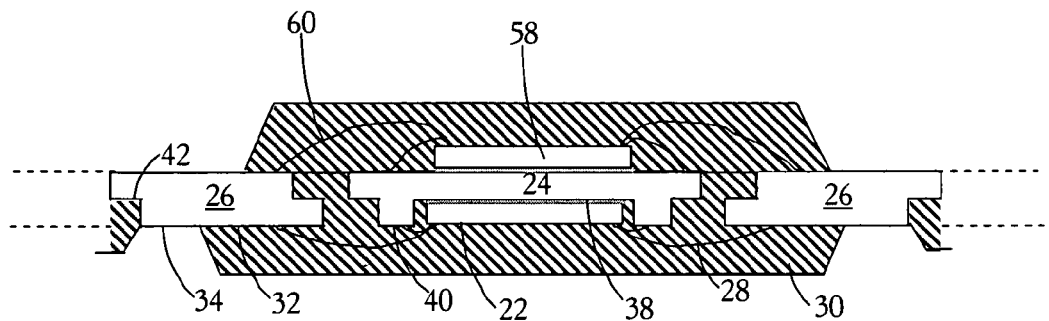

After curing the molding compound 30, the leadframe strip 20 is released from the mold (FIG. 5H).

Figure 5I:
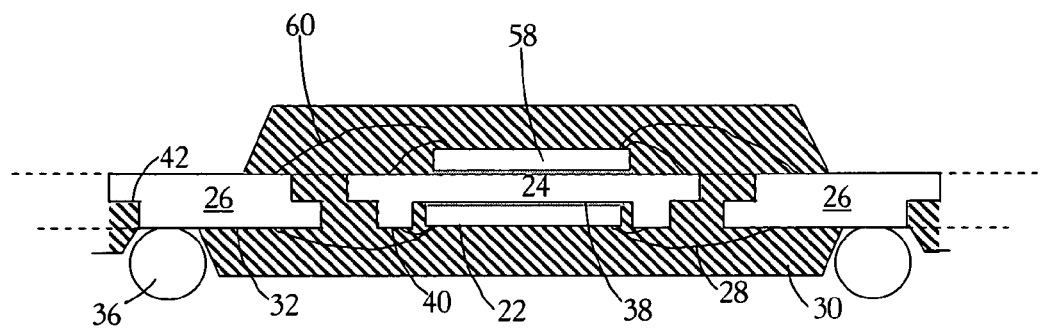

Next, the external contacts 36 in the form of solder ball contacts are deposited on the exposed remaining portion 34 on the one side of the contact pads 26 (FIG. 5I). The solder ball contacts are deposited by applying flux to the exposed remaining portion 34 on the one side of the contact pads 26 and after placement of the solder balls by pick and place technique, the solder balls are reflowed using known reflow techniques. As shown, the external contacts (solder balls) 36 protrude from the mold compound to provide integrated circuit package standoff. The external contacts 36 are thereby connected to the contact pads 26 and through the wire bonds 28 to the semiconductor die 22. The external contacts are also thereby connected through the contact pads 26 and the gold wire bonds 60 to the second semiconductor die 58. The external contacts 36 thus provide signal and power connections for the semiconductor die 22 and the second semiconductor die 58. In the present embodiment, the external contacts are tin/lead eutectic solder.

Figure 5J:
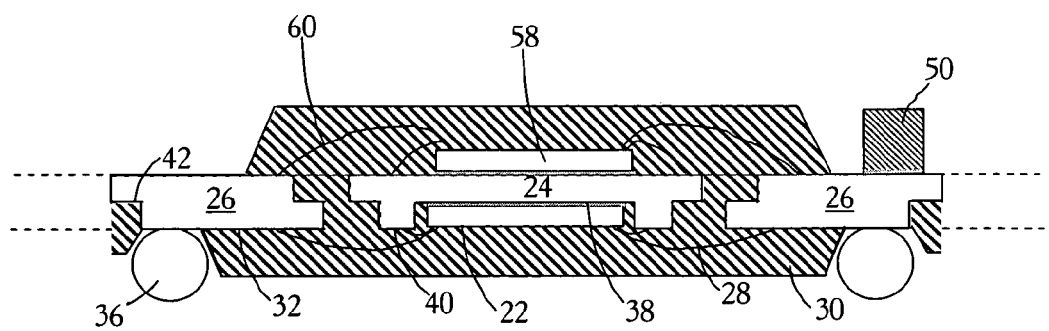

A passive component 50 is mounted to exposed portions of the opposing second side of the contact pads 26 using conductive epoxy and the epoxy is cured (FIG. 5J). The passive component 50 is one of a capacitor, an inductor, and a resistor.

Figure 5K:
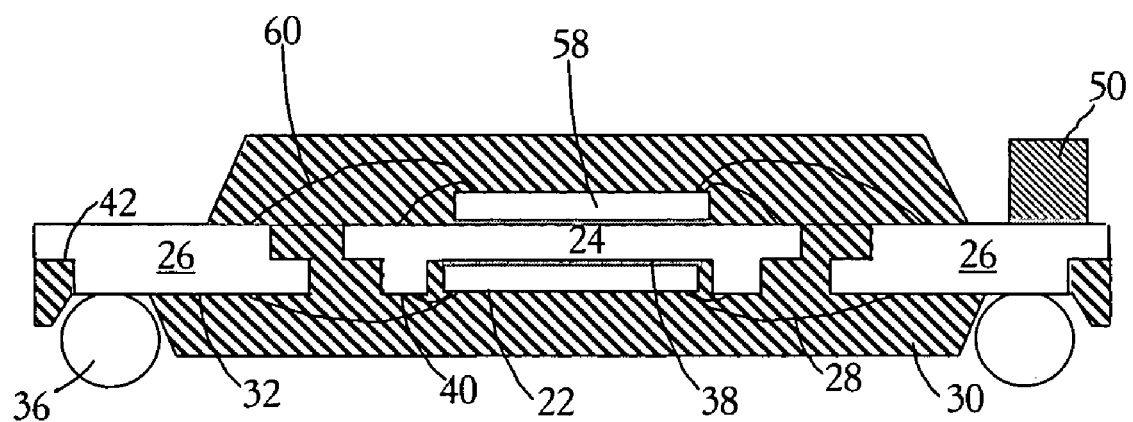

Finally, the individual units are singulated from the full leadframe strip 20 by one of die punching and saw singulation, resulting in the integrated circuit package shown in FIG. 5K.

Specific embodiments of the present invention have been shown and described herein. Modifications and variations to these embodiments may occur to those skilled in the art. For example, the size and shape of many of the elements may differ while still performing the same function. In one alternative embodiment, rather than tin/lead eutectic solder as described above, the external contacts 36 can be substantially lead-free solder. Also, while some of the embodiments described above include a passive component 50 mounted to the contact pads 26, any suitable number of passive components 50 can be included and any suitable combination of passive components 50 such as capacitors, inductors and resistors, can be used. Further, the order of some of the steps of the process as described above, may vary.

Still other modifications and variations may occur to those skilled in the art. All such modifications and variations are believed to be within the sphere and scope of the present invention.

What is claimed is:

1. An integrated circuit package comprising:
a semiconductor die mounted to a die attach pad;
a plurality of contact pads circumscribing said die attach pad; each of said contact pads having,
a central portion,
an interior peripheral portion, located on an interior side of the central portion between the central portion and the die attach pad, and proximate to a first side of the central portion, and
an exterior peripheral portion, located on an exterior side of the central portion, opposite the interior peripheral portion, and proximate a second side of the central portion,
wherein the interior peripheral portion and the exterior peripheral portion have respective thicknesses less than a thickness of the central portion;
wire bonds connecting said semiconductor die to at least one of said contact pads;
an overmold covering a first side of said semiconductor die, said wire bonds, said internal peripheral portion of each of said contact pads, and a portion of the first side of said contact pads such that a remaining portion of said first side of said contact pads is uncovered and the second side of said contact pads is uncovered;
external contacts disposed on said first side of said contact pads, at the uncovered remaining portion, the external contacts forming balls which protrude from said overmold; and
at least one of an active and a passive component mounted to said second side of at least one of, said die attach pad and at least one of said contact pads,
wherein a maximum thickness of the central portion of each of the plurality of contact pads is substantially equal to a combined thickness of the die attach pad and the semiconductor die.

2. The integrated circuit package according to claim 1, wherein said at least one of an active and a passive component comprises at least one of a capacitor, an inductor and a resistor.

3. The integrated circuit package according to claim 1, wherein said external contacts comprise solder ball contacts.

4. The integrated circuit package according to claim 1, wherein peripheral portions of said contact pads have a thickness that is less than the thickness of the remainder of said contact pads.

5. The integrated circuit package according to claim 1, wherein at least a portion of said die attach pad has a thickness less than the thickness of a portion of said contact pads.

6. The integrated circuit package according to claim 5, wherein said semiconductor die is mounted to said die attach pad at the portion of the die attach pad having a thickness less than the thickness of said portion of said contact pads.

7. The integrated circuit package according to claim 5, further comprising a ground ring on said die attach pad.

8. The integrated circuit package according to claim 7, further comprising wire bonds connecting said semiconductor die to said ground ring.

9. The integrated circuit package according to claim 1, wherein said at least one of an active and a passive component comprises a second semiconductor die mounted to a second side of said die attach pad, said package further comprising wire bonds connecting said second semiconductor die to ones of said contact pads, said overmold further covering said second semiconductor die, the wire bonds connecting the second semiconductor die and ones of said contact pads, and a portion of the second side of said contact pads.

10. The integrated circuit package according to claim 9, further comprising at least one passive component mounted to exposed portions of said second side of ones of said contact pads.

11. The integrated circuit package according to claim 10, wherein said at least one passive component comprises at least one of a capacitor, an inductor and a resistor.

12. The integrated circuit package according to claim 1, wherein said at least one of an active and a passive component comprises a leadless plastic chip carrier.

13. The integrated circuit package according to claim 12 wherein said leadless plastic chip carrier comprises:
a second die attach pad;
a second semiconductor die mounted to said second die attach pad;
at least one row of second contact pads circumscribing said second semiconductor die;
a plurality of second wire bonds connecting bonding pads of said second semiconductor die to said one of said contact pads; and
a second overmold covering said second semiconductor die, said second contact pads and said second wire bonds.

14. The integrated circuit package according to claim 13, wherein a second side of said second die attach pad is mounted to the second side of said first die attach pad and ones of said second contact pads are mounted to the second side of the first contact pads.

* * * * *